United States Patent
Kim et al.

(10) Patent No.: US 12,401,937 B2
(45) Date of Patent: Aug. 26, 2025

(54) BATTERY AND ELECTRONIC DEVICE INCLUDING THE SAME

(71) Applicant: Samsung Electronics Co., Ltd., Suwon-si (KR)

(72) Inventors: Sungjin Kim, Suwon-si (KR); Chulhan Kim, Suwon-si (KR); Kiwook Han, Suwon-si (KR); Sohee Kim, Suwon-si (KR); Haekeu Park, Suwon-si (KR); Juhee Chang, Suwon-si (KR); Sigyung Jung, Suwon-si (KR); Hyeonyeong Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 18/353,384

(22) Filed: Jul. 17, 2023

(65) Prior Publication Data

US 2024/0031730 A1    Jan. 25, 2024

Related U.S. Application Data

(63) Continuation of application No. PCT/KR2023/009920, filed on Jul. 12, 2023.

(30) Foreign Application Priority Data

Jul. 20, 2022 (KR) .......... 10-2022-0089447
Aug. 9, 2022 (KR) .......... 10-2022-0099582

(51) Int. Cl.
*H04R 1/10*    (2006.01)
*H05K 1/02*    (2006.01)
*H05K 1/16*    (2006.01)

(52) U.S. Cl.
CPC .......... *H04R 1/1091* (2013.01); *H05K 1/028* (2013.01); *H05K 1/165* (2013.01)

(58) Field of Classification Search
CPC ...... H04R 1/1019; H04R 1/10; H04R 1/1025; H04R 1/1061; H04R 25/605; H04R 25/60;
(Continued)

(56) References Cited

U.S. PATENT DOCUMENTS

2018/0077484 A1    3/2018   Yeung et al.
2018/0242074 A1    8/2018   Xu et al.
(Continued)

FOREIGN PATENT DOCUMENTS

CN    113225633        8/2021
CN    213960298 U      8/2021
(Continued)

OTHER PUBLICATIONS

Search Report and Written Opinion dated Oct. 13, 2023 issued in International Patent Application No. PCT/KR2023/009920.
(Continued)

*Primary Examiner* — Ahmad F. Matar
*Assistant Examiner* — Sabrina Diaz
(74) *Attorney, Agent, or Firm* — Nixon & Vanderhye, P.C.

(57) ABSTRACT

An electronic device according to an embodiment of the disclosure may include: a battery including an anode having a first length and a cathode having a second length different from the first length, a flexible printed circuit board electrically connected to the battery and surrounding at least part of a side surface of the battery, and a speaker stacked with the battery. The flexible printed circuit board may include a power wiring electrically connected to the anode and a ground wiring electrically connected to the cathode. A first current of a first winding direction generated due to a length difference between the cathode and the anode may flow in the battery, and a second current of a second winding
(Continued)

direction opposite to the first winding direction may flow in a wiring disposed closer to the speaker between the power wiring and the ground wiring.

20 Claims, 17 Drawing Sheets

(58) Field of Classification Search
CPC .... H04R 25/604; H04R 25/30; H04R 25/602; H05K 1/028; H05K 1/165
USPC .................................. 381/74, 323, 324, 328
See application file for complete search history.

(56) References Cited

U.S. PATENT DOCUMENTS

| | | |
|---|---|---|
| 2021/0037304 A1 | 2/2021 | Huang et al. |
| 2021/0083315 A1 | 3/2021 | Pregler et al. |
| 2021/0176557 A1 | 6/2021 | Schreuder |
| 2021/0250676 A1 | 8/2021 | Kim et al. |
| 2021/0400370 A1 | 12/2021 | Pine et al. |

FOREIGN PATENT DOCUMENTS

| | | | |
|---|---|---|---|
| CN | 215070172 U | | 12/2021 |
| CN | 216528992 U | | 5/2022 |
| CN | 115064750 A | * | 9/2022 |
| CN | 115103255 A | * | 9/2022 |
| CN | 217691453 U | * | 10/2022 |
| CN | 116683123 A | * | 9/2023 |
| EP | 4443576 A1 | | 10/2024 |
| KR | 20180000499 A | | 1/2018 |
| KR | 10-2021-0101597 | | 8/2021 |
| KR | 20220012591 A | | 2/2022 |
| KR | 10-2022-0037250 | | 3/2022 |
| KR | 10-2022-0101834 | | 7/2022 |

OTHER PUBLICATIONS

Extended European Search Report dated May 22, 2025 issued in European Patent Application No. 23843257.9.

* cited by examiner

BATTERY AND ELECTRONIC DEVICE INCLUDING THE SAME

CROSS-REFERENCE TO RELATED APPLICATIONS

This application is a continuation of International Application No. PCT/KR2023/009920 designating the United States, filed on Jul. 12, 2023, in the Korean Intellectual Property Receiving Office and claiming priority to Korean Patent Application No 10-2022-0089447, filed on Jul. 20, 2022, in the Korean Intellectual Property Office, and to Korean Patent Application No. 10-2022-0099582, filed on Aug. 9, 2022, in the Korean Intellectual Property Office, the disclosures of all of which are incorporated by reference herein in their entireties.

BACKGROUND

Field

The disclosure relates to a battery and an electronic device including the same.

Description of Related Art

Owing to the development of information and communication technology and semiconductor technology, various electronic devices have been rapidly proliferated and increasingly used. Particularly, recent electronic devices have been developed for communication while being carried. Further, electronic devices may output stored information as sound or an image. As the integration level of the electronic devices increases and ultra-high speed, large-capacity wireless communication becomes common, a single electronic device such as a mobile communication terminal is equipped with various functions over the recent years. For example, not only a communication function but also a multimedia function such as music/video playback is integrated in a single electronic device. Such electronic devices are miniaturized so that users may conveniently carry them.

As electronic devices are used in daily living, users' demands for portability and usability of the electronic devices may increase. According to the users' demands, for example, wearable electronic devices that may be carried and used while worn on the body, such as wireless earphones, smart watches, or glasses-type electronic devices, are commercialized, and secondary batteries which are chargeable and dischargeable are used as a power source of the electronic devices.

SUMMARY

An electronic device according to an example embodiment of the disclosure may include: a battery including an anode having a first length and a cathode having a second length different from the first length, a flexible printed circuit board electrically connected to the battery and surrounding at least part of a side surface of the battery, and a speaker stacked with the battery. The flexible printed circuit board may include: a power wiring electrically connected to the anode and a ground wiring electrically connected to the cathode. A first current having a first winding direction, generated due to a length difference between the cathode and the anode, may flow in the battery. A second current having a second winding direction opposite to the first winding direction may flow in a wiring disposed closer to the speaker between the power wiring and the ground wiring.

An electronic device according to an example embodiment of the disclosure may include: a battery including an anode having a first length and a cathode having a second length greater than the first length, a flexible printed circuit board electrically connected to the battery and surrounding at least part of a side surface of the battery, and a speaker stacked with the battery. The flexible printed circuit board may include a power wiring electrically connected to the anode and a ground wiring electrically connected to the cathode. A first current having a first winding direction generated based on a length difference between the cathode and the anode may flow in the battery. A second current having a second winding direction opposite to the first winding direction may flow in the ground wiring disposed closer to the speaker than the power wiring.

An electronic device according to an example embodiment of the disclosure may include: a battery including an anode having a first length and a cathode having a second length greater than the first length, a flexible printed circuit board electrically connected to the battery and surrounding at least part of a side surface of the battery, and a speaker stacked with the battery. The flexible printed circuit board may include a power wiring electrically connected to the anode and a ground wiring electrically connected to the cathode. A first current having a first winding direction generated based on a length difference between the cathode and the anode may flow in the battery. A second current having a second winding direction identical to the first winding direction may flow in the power wiring disposed closer to the speaker than the ground wiring.

DETAILED DESCRIPTION

Figure 1:
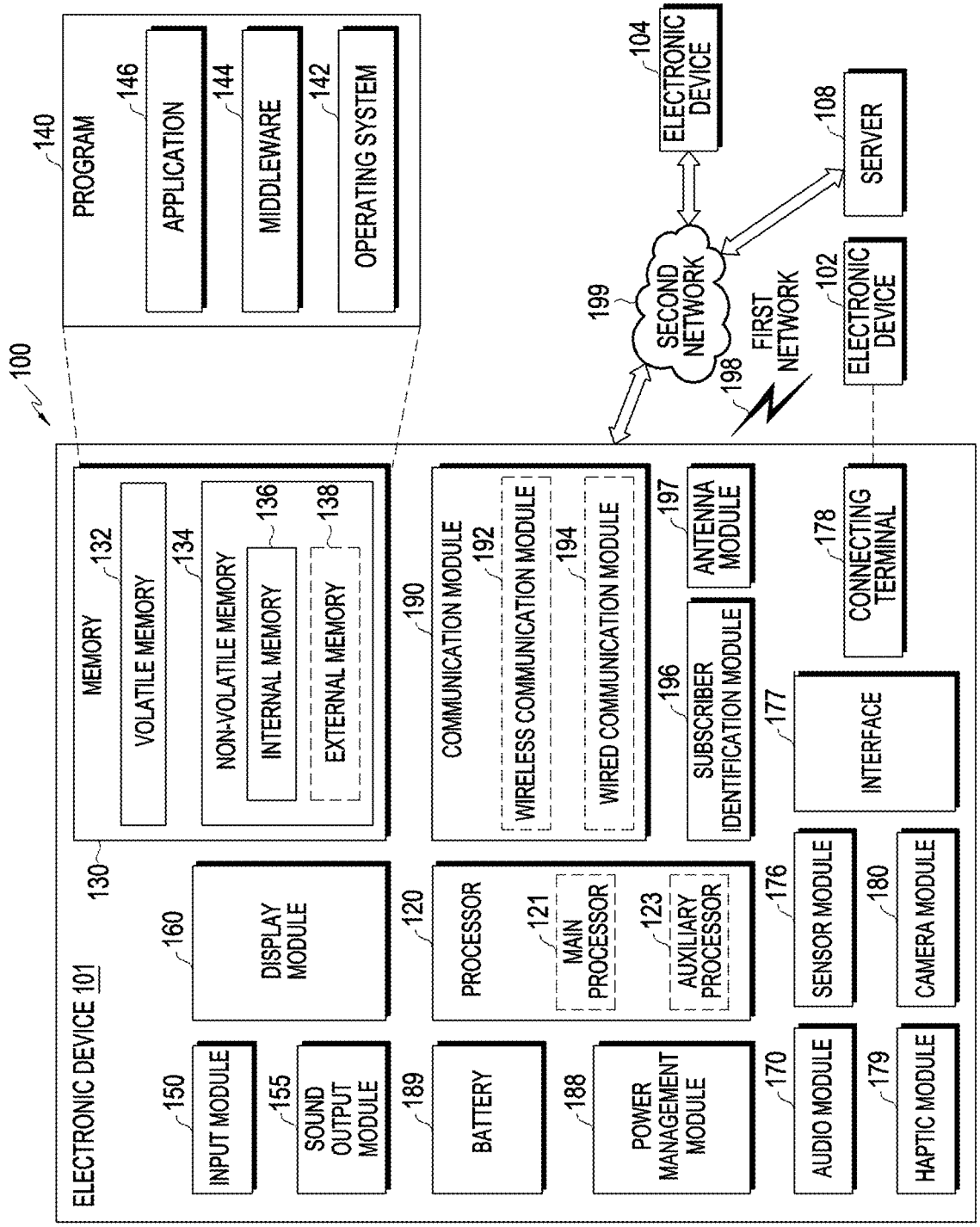
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform one data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store one data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or close to the first surface and capable of supporting a designated high-frequency band (e.g., the mmWave band), and a plurality of antennas (e.g., array antennas) disposed on a second surface (e.g., the top or a side surface) of the printed circuit board, or close to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to an embodiment may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that an embodiment of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with an embodiment of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to an embodiment, each component (e.g., a module or a program) of the above-described components may include a single entity or multiple entities, and some of the multiple entities may be separately disposed in different components. According to an embodiment, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
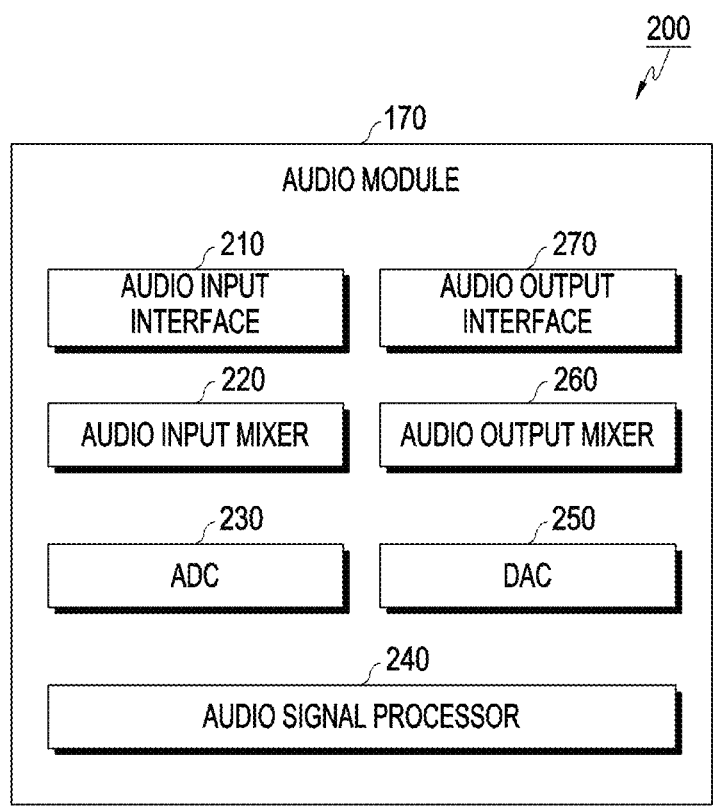
FIG. 2 is a block diagram illustrating an audio module according to an embodiment of the disclosure.

FIG. 2 is a block diagram 200 illustrating the audio module 170 according to an embodiment. Referring to FIG. 2, the audio module 170 may include, for example, an audio input interface 210, an audio input mixer 220, an analog-to-digital converter (ADC) 230, an audio signal processor 240, a digital-to-analog converter (DAC) 250, an audio output mixer 260, or an audio output interface 270.

The audio input interface 210 may receive an audio signal corresponding to a sound obtained from the outside of the electronic device 101 via a microphone (e.g., a dynamic microphone, a condenser microphone, or a piezo microphone) that is configured as part of an input module (e.g., the input module 150 of FIG. 1) or separately from the electronic device 101. For example, if an audio signal is obtained from an external electronic device (e.g., the electronic device 102 of FIG. 1) (e.g., a headset or a microphone), the audio input interface 210 may be connected with the external electronic device 102 directly via a connecting terminal (e.g., the connecting terminal 178 of FIG. 1), or wirelessly (e.g., Bluetooth™ communication) via a wireless communication module (e.g., the wireless communication module 192) to receive the audio signal. According to an embodiment, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to an embodiment, additionally or alternatively, the audio input interface 210 may receive an audio signal from another component (e.g., the processor 120 or the memory 130) of the electronic device 101.

The audio input mixer 220 may synthesize a plurality of inputted audio signals into at least one audio signal. For example, according to an embodiment, the audio input mixer 220 may synthesize a plurality of analog audio signals inputted via the audio input interface 210 into at least one analog audio signal.

The ADC 230 may convert an analog audio signal into a digital audio signal. For example, according to an embodiment, the ADC 230 may convert an analog audio signal received via the audio input interface 210 or, additionally or alternatively, an analog audio signal synthesized via the audio input mixer 220 into a digital audio signal.

The audio signal processor 240 may perform various processing on a digital audio signal received via the ADC 230 or a digital audio signal received from another component of the electronic device 101. For example, according to an embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an embodiment, one or more functions of the audio signal processor 240 may be implemented in the form of an equalizer.

The DAC 250 may convert a digital audio signal into an analog audio signal. For example, according to an embodiment, the DAC 250 may convert a digital audio signal processed by the audio signal processor 240 or a digital audio signal obtained from another component (e.g., the processor (120) or the memory (130)) of the electronic device 101 into an analog audio signal.

The audio output mixer 260 may synthesize a plurality of audio signals, which are to be outputted, into at least one audio signal. For example, according to an embodiment, the audio output mixer 260 may synthesize an analog audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 101 via the sound output module 155. The sound output module 155 may include, for example, a speaker, such as a dynamic driver or a balanced armature driver, or a receiver. According to an embodiment, the sound output module 155 may include a plurality of speakers. For example, the audio output interface 270 may output audio signals having a plurality of different channels (e.g., stereo channels or 5.1 channels) via at least some of the plurality of speakers. According to an embodiment, the audio output interface 270 may be connected with the external electronic device 102 (e.g., an external speaker or a headset) directly via the connecting terminal 178 or wirelessly via the wireless communication module 192 to output an audio signal.

According to an embodiment, the audio module 170 may generate, without separately including the audio input mixer 220 or the audio output mixer 260, at least one digital audio signal by synthesizing a plurality of digital audio signals using at least one function of the audio signal processor 240.

According to an embodiment, the audio module 170 may include an audio amplifier (not shown) (e.g., a speaker amplifying circuit) that is capable of amplifying an analog audio signal inputted via the audio input interface 210 or an audio signal that is to be outputted via the audio output interface 270. According to an embodiment, the audio amplifier may be configured as a module separate from the audio module 170.

Figure 3:
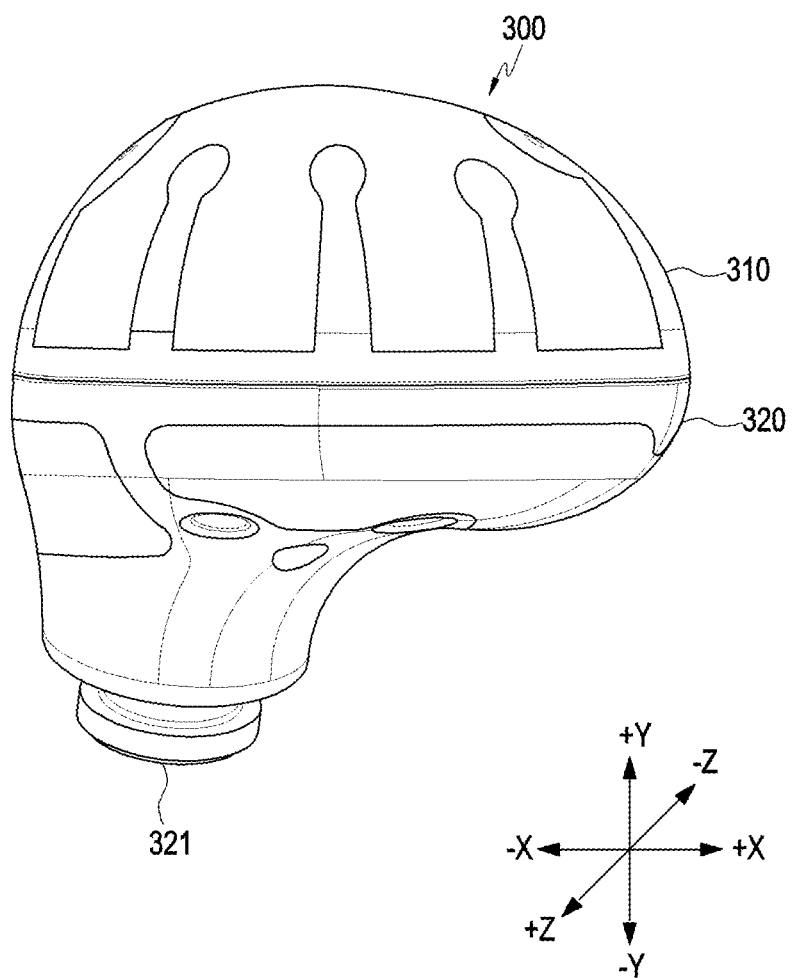
FIG. 3 is a perspective view illustrating an electronic device according to an embodiment of the disclosure.

FIG. 3 is a perspective view illustrating an electronic device 300 according to an embodiment.

The electronic device 300 illustrated in FIG. 3 may be the same as or similar to the electronic device 101 illustrated in FIG. 1. Accordingly, a description of the same components may be avoided.

Referring to FIG. 3, the electronic device 300 may include a first housing 310 and a second housing 320 connected to (or coupled with) the first housing 310.

According to an embodiment, the electronic device 300 may correspond to an electronic device wearable on a user's body part (e.g., a user's ear or head). The electronic device 300 may include an in-ear earset, an in-ear headset, or a hearing aid. Besides, the electronic device 200 may include an electronic device in which a speaker is mounted.

In the drawings of the disclosure, a kernel-type in-ear earset mounted on the external auditory meatus leading from the pinna to the eardrum may be described as an example of the electronic device 300. The disclosure is not limited thereto, and the electronic device 300 may be an open-type earphone mounted on the pinna.

According to an embodiment, the electronic device 300 may be connected to an external electronic device wiredly or wirelessly. In this case, the electronic device 300 may serve as an audio output device that outputs a sound signal generated from the external electronic device to the outside. In an example, the electronic device 300 may serve as an audio input device that receives an audio signal corresponding to a sound obtained from the outside of the external electronic device.

According to an embodiment, the first housing 310 and the second housing 320 may include partial curved surfaces having a specified curvature. In an example, the first housing 310 may extend seamlessly from one end thereof and be connected to the second housing 320. For example, the first housing 310 and the second housing 320 may be formed to contact each other on an X-Z plane.

According to an embodiment, the first housing 310 or the second housing 320 may be formed of coated or tinted glass, ceramic, polymer, metal (e.g., aluminum, stainless steel (STS), or magnesium), resin (e.g., polycarbonate, polyethylene, polypropylene, or polystyrene), or a combination of at least two of the above materials. In an example, the first housing 310 and the second housing 320 may be formed by injection.

According to an embodiment, the second housing 320 may include a protrusion 321 seated on an ear of a user who uses the electronic device 300. In an example, the protrusion 321 may be formed to extend in a −Y-axis direction from the second housing 320.

The electronic device 300 illustrated in FIG. 3 corresponds to one example, not limiting the shape of a device to which the technical idea of the disclosure is applied. The technical idea of the disclosure is applicable to various types of wearable electronic devices including a protrusion seated on an ear. For example, the technical idea of the disclosure may also be applied to a wearable electronic device in the shape of a kidney bean.

An embodiment will be described below in the context of the electronic device 300 illustrated in FIG. 3, for convenience of description.

Figure 4:
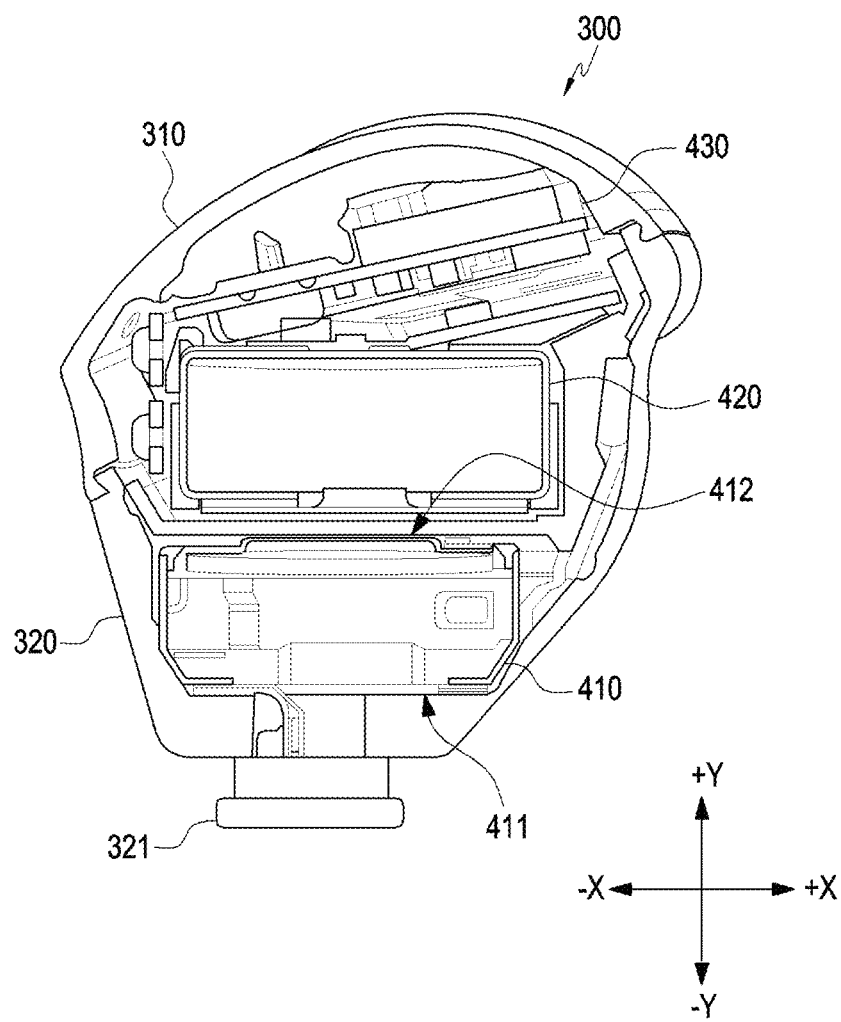
FIG. 4 is a cross-sectional view illustrating an electronic device, viewed from a side, according to an embodiment of the disclosure.

FIG. 4 is a cross-sectional view illustrating the electronic device 300, viewed from a side thereof according to an embodiment. The cross-sectional view of FIG. 4 may be understood as a side cross-sectional view of the electronic device 300 of FIG. 3 viewed from a +Z axis direction.

Referring to FIG. 4, the electronic device 300 may include a speaker 410, a battery 420, and a printed circuit board (PCB) 430 (e.g., a printed board assembly (PBA), a flexible PCB (FPCB), or a rigid-flexible PCB (RFPCB)) in an internal space formed by the first housing 310 and the second housing 320. In an example, the electronic device 300 may include other components in addition to the components illustrated in FIG. 4. For example, the electronic device 300 may further include a wireless communication circuit or a microphone in the internal space formed by the first housing 310 and the second housing 320. In another example, some of the components of the electronic device 300 illustrated in FIG. 4 may be omitted or replaced with other similar components. For example, the electronic device 300 may be configured such that the protrusion 321 does not protrude outward from the electronic device 300.

According to an embodiment, the electronic device 300 may include the speaker 410 inside the second housing 320 such that the speaker 420 is close to the protrusion 321. The speaker 410 may function to receive an electrical signal through a circuit (e.g., the PCB 430) inside the electronic device 300 and convert the received electrical signal into physical vibrations.

According to an embodiment, the speaker 410 may be disposed in parallel with the battery 420 in the second housing 320. For example, the speaker 410 may be stacked with the battery along a Y axis. For example, the speaker 410 may be disposed coaxially with the battery 420.

According to an embodiment, the speaker 410 may include a first surface 411 facing the protrusion 321 (e.g., the −Y-axis direction in FIG. 4), and a second surface 412 opposite to the first surface 411 (e.g., a +Y-axis direction of FIG. 4).

According to an embodiment, the speaker 410 may output a front-radiated sound through the first surface 411 facing the protrusion 321. The speaker 410 may output a rear-radiated sound through the second surface 412 opposite to the first surface 411.

According to an embodiment, the battery 420 may be disposed in the internal space of the electronic device 300 formed by coupling between the first housing 310 and the second housing 320. According to an embodiment, the battery 420 may supply power to at least one component of the electronic device 300. According to an embodiment, the battery 420 may be a rechargeable secondary cell. In an example, components included in the electronic device 300 may be driven by power output from the battery 420.

According to an embodiment, the battery 420 may be formed in various shapes. According to an embodiment, the battery 420 may be a small battery to be disposed in a miniaturized wearable electronic device (e.g., the electronic device 300 of FIG. 3). For example, the battery 420 may be a coin-shaped or cylinder-shaped battery.

According to an embodiment, the battery 420 may include a plurality of batteries. For example, the battery 420 may include an inner battery and an outer battery surrounding the inner battery.

According to an embodiment, the battery 420 may include a cathode substrate, ananode substrate, a separator, and an electrolyte. In an example, the cathode substrate and the anode substrate included in the battery 420 may form a winding structure.

According to an embodiment, the battery 420 may be disposed in an area corresponding to the second surface 412 of the speaker 410. In an example, the battery 420 may be disposed to face the second surface 412 of the speaker 410. In an example, the battery 420 may be stacked on the second surface 412 of the speaker 410 (e.g., in the +Y direction in FIG. 4).

According to an embodiment, the battery 420 may include a first surface facing the speaker 410 (e.g., the −Y-axis direction in FIG. 4) and a second surface opposite to the first surface (e.g., the +Y-axis direction in FIG. 4).

According to an embodiment, the PCB 430 may be disposed in the internal space of the electronic device 300 formed by the coupling between the first housing 310 and the second housing 320. In an example, at least one electronic component (e.g., the communication module 190 or the sensor module 176 of FIG. 1) may be mounted on the PCB 430.

According to an embodiment, the PCB 430 may include an FPCB.

According to an embodiment, the PCB 430 may be electrically connected to the battery 420 and disposed to surround at least part of a side surface of the battery 420.

According to an embodiment, a space for accommodating other electronic components in addition to the speaker 410, the battery 420, and the PCB 430 may further be formed in the internal space formed by the coupling between the first housing 310 and the second housing 320. While the speaker 410, the battery 420, and the PCB 430 are shown as arranged in parallel in FIG. 4, this arrangement does not necessarily limit the internal shapes of the first housing 310 and the second housing 320 and the arrangement of the components. The detailed arrangement of the components included in the first housing 310 and the second housing 320 may vary according to embodiments.

Figure 5:
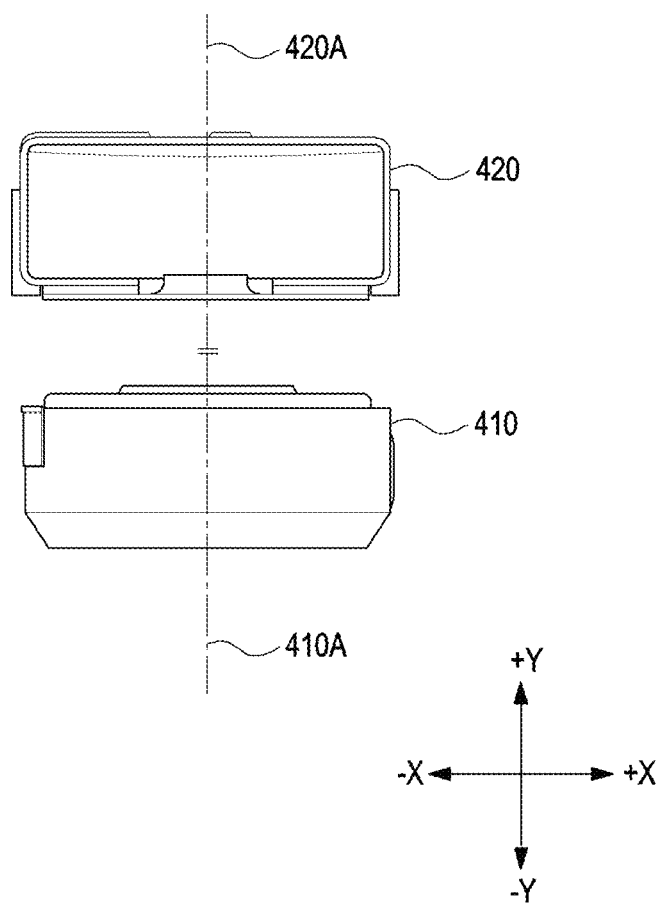
FIG. 5 is a side view illustrating a speaker and a battery according to an embodiment of the disclosure.

FIG. 5 is a side view illustrating the speaker 410 and the battery 420 according to an embodiment of the disclosure.

Referring to FIG. 5, an electronic device (e.g., the electronic device 300 of FIG. 4) may include the speaker 410 and the battery 420. The speaker 410 and the battery 420 illustrated in FIG. 5 may be the same as or similar to the speaker 410 and the battery 420 illustrated in FIG. 4. Therefore, a description of the same components may be avoided. The structure of FIG. 5 may be selectively combined with the structures of FIGS. 3 and 4.

Referring to FIG. 5, according to an embodiment, the speaker 410 and the battery 420 may be disposed close to each other. For example, the speaker 410 and the battery 420 may be stacked. For example, the speaker 410 may be disposed in one direction (the Y-axis direction) of the battery 420.

According to an embodiment, the speaker 410 may be formed to be substantially circular. The speaker 410 may be formed to be circular with respect to a central axis 410A.

According to an embodiment, the battery 420 may be formed to be substantially. The battery 420 may be formed to be circular with respect to a central axis 420A.

According to an embodiment, the speaker 410 and the battery 420 may be coaxially disposed. According to an embodiment, the central axis 410A of the speaker 410 and the central axis 420A of the battery 420 may be disposed close to each other or coincide with each other.

According to an embodiment, the speaker 410 may receive power directly or indirectly from the battery 420 and convert an electrical signal into wave energy. According to an embodiment, the speaker 410 may be electrically connected directly to the battery 420 and receive power from the battery 420. According to an embodiment, as the speaker 410 is electrically connected to the PCB 430, and the PCB 430 is electrically connected to the battery 420, the speaker 410 may receive power from the battery 420 through the PCB 430. According to an embodiment, the speaker 410 may be electrically connected to a power management module (e.g., the power management module 188 of FIG. 1) and receive power from the power management module 188.

Figure 7A:
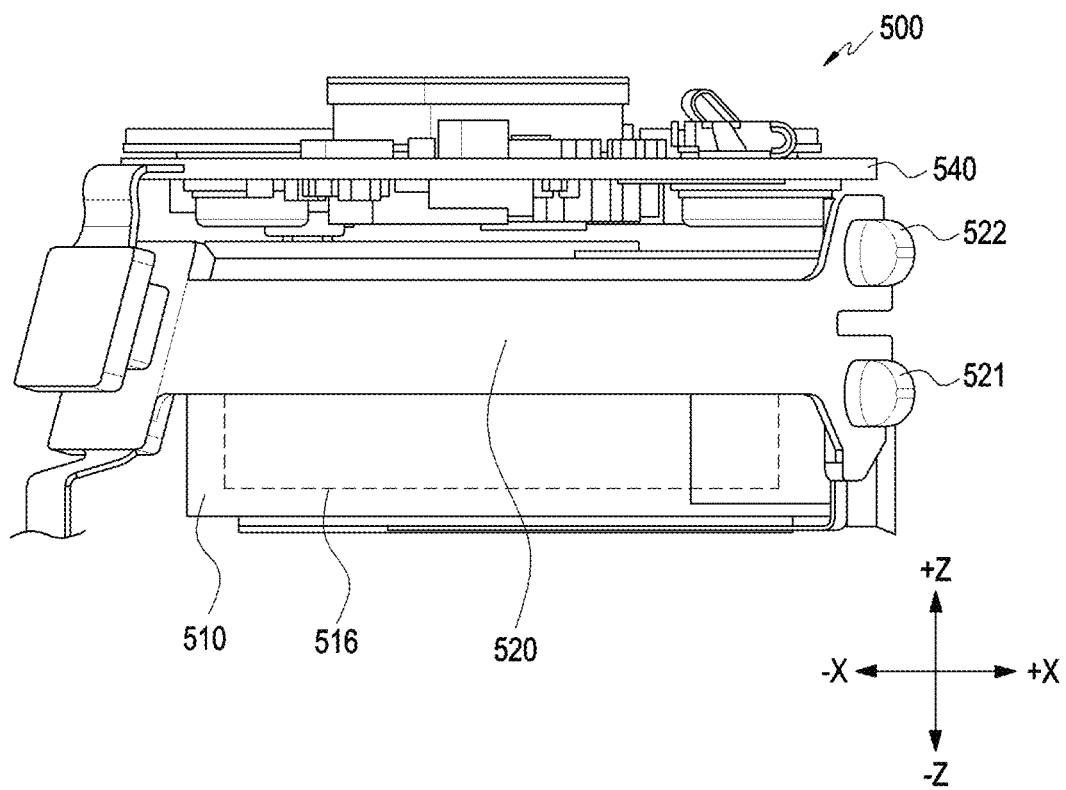
FIG. 7A is a front view illustrating a battery and a printed circuit board according to an embodiment of the disclosure.
Figure 7B:
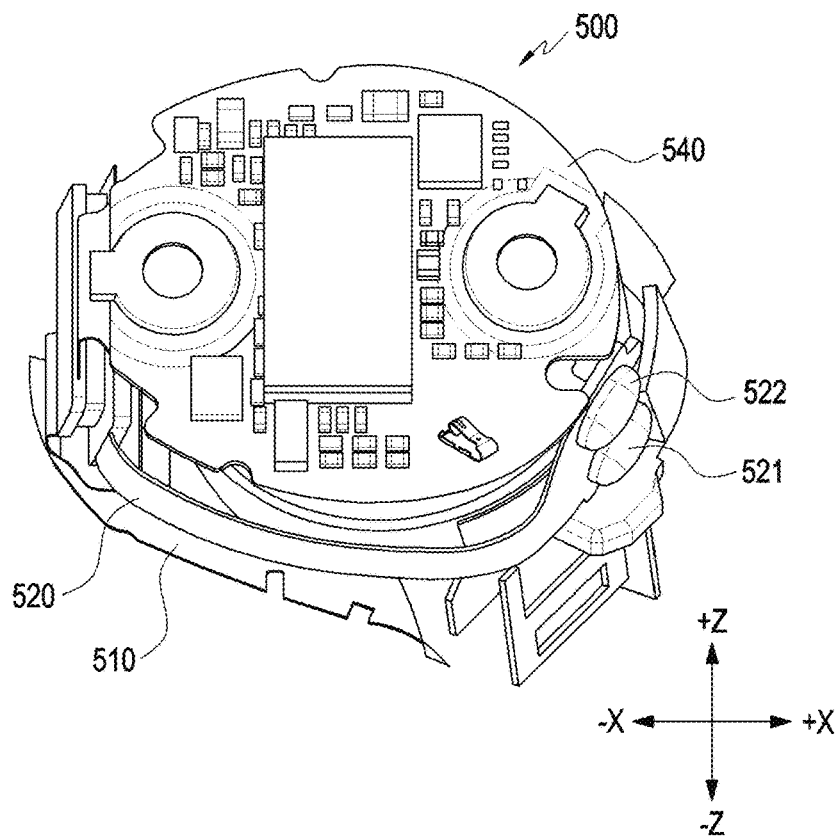
FIG. 7B is a perspective view illustrating a battery and a printed circuit board according to an embodiment of the disclosure.
Figure 8A:
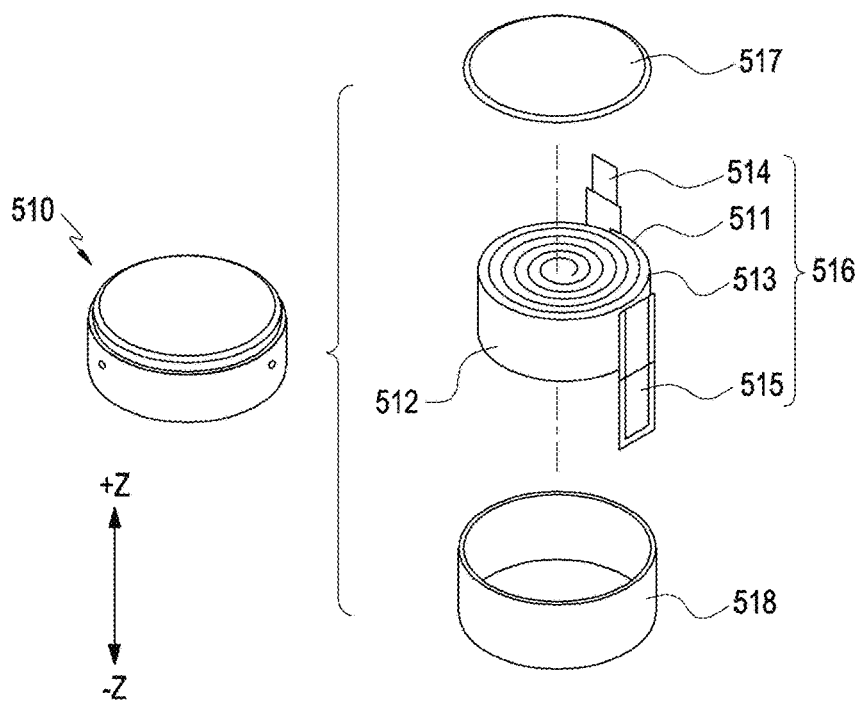
FIG. 8A is a perspective view and an exploded perspective view illustrating a battery according to an embodiment of the disclosure.
Figure 8B:
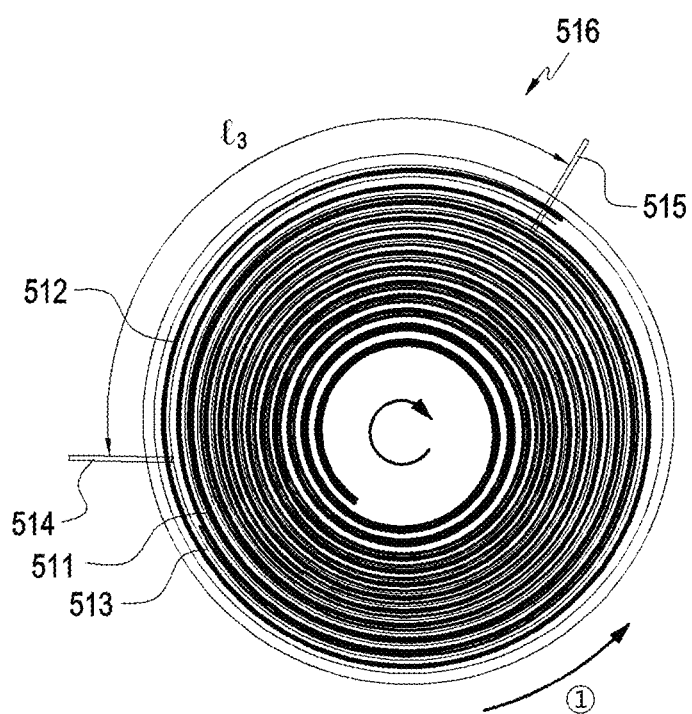
FIG. 8B is a diagram illustrating an electrode assembly viewed from above.

FIGS. 6A to 6E are perspective views illustrating an electronic device 500 according to an embodiment of the disclosure. FIG. 7A is a front view illustrating a battery 510 and PCBs 520 and 540 according to an embodiment of the disclosure. FIG. 7B is an exploded perspective view illustrating the battery 510 and the PCBs 520 and 540 according to an embodiment of the disclosure. FIG. 8A is a perspective view and exploded perspective view illustrating the battery 510 according to an embodiment of the disclosure. FIG. 8B is a diagram illustrating an electrode assembly 516 viewed from above.

Referring to FIGS. 6A to 8B, according to an embodiment, the electronic device 500 (e.g., the electronic device 101 of FIG. 1 or the electronic device 300 of FIG. 3) may include a housing (e.g., the first housing 310 and the second housing 320 of FIGS. 3 and 4), the battery 510 disposed inside the housing, the PCBs 520 and 540 (e.g., FPCBs or RFPCBs), and a speaker 530 stacked with the battery 510. For example, the electronic device 500 of FIGS. 6A to 7B is the electronic device 300 of FIGS. 3 to 4 from which the housing (e.g., the first housing 310 and the second housing 320 of FIGS. 3 to 4) is removed.

Referring to FIGS. 6A to 8B, the configurations of the electronic device 500, the battery 510, the PCBs 520 and 540, and the speaker 530 of FIGS. 6A to 8B may be wholly or partially identical to those of the electronic device 300, the battery 420, the PCB 430, and the speaker 410 of FIGS. 4 and 5. The structures of FIGS. 6A to 8B may be selectively combined with the structures of FIGS. 4 and 5.

In FIGS. 6A to 8B, 'X' may be defined and interpreted as a width direction of the electronic device 500, 'Y' may be defined and interpreted as a depth direction of the electronic device 500, and 'Z' may be defined and interpreted as a height direction of the electronic device 500. In an embodiment of the disclosure, 'X' may mean a $(1\text{-}1)^{th}$ direction (+X direction) and a $(1\text{-}2)^{th}$ direction (−X direction). In an embodiment of the disclosure, 'Y' may mean a $(2\text{-}1)^{th}$ direction (+Y direction) and a $(2\text{-}2)^{th}$ direction (−Y direction). In an embodiment of the disclosure, 'Z' may mean a $(3\text{-}1)^{th}$ direction (+Z direction) and a $(3\text{-}2)^{th}$ direction (−Z direction).

According to an embodiment, referring to FIG. 8A, the battery 510 may be a coin-type battery. The battery 510 may include an exterior member 518 in the form of a can and/or cup to be coupled, a cover 517 sealing the exterior member 518, the electrode assembly 516 in a jelly-roll or stack structure, and an electrolyte (not shown) injected into the battery 510. The electrode assembly 516 may include at least one anode 511, at least one cathode) 512, at least one separator 513 disposed between the at least one anode 511 and the at least one cathode 512, an anode tab 514 connected to an end of the anode 511, and a cathode tab 515 connected to an end of the cathode 512.

According to an embodiment, the electrode assembly 516 may be a form in which the anode 511, the cathode 512, and the separator 513 are wound sequentially from a central axis, as illustrated in FIG. 8B.

According to an embodiment, the anode 511 may include ananode substrate, ananode mixture (an anode active material, a conductive material, and a binder) coated on one surface of the anode substrate, and the anode tab 514 attached to the one surface of the anode substrate.

According to an embodiment, the cathode 512 may include a cathode substrate, a cathode mixture (a cathode active material, a conductive material, and a binder) applied to one surface of the cathode substrate, and the cathode tab 515 attached to the one surface of the cathode substrate.

According to an embodiment, the battery 510 may be in the form of a jelly roll formed by winding the anode 511 and the cathode 512 with the separator 513 interposed therebetween. The anode 511, the cathode 512, and the separator 513 may be wound in a first direction (e.g., a clockwise direction) or in a second direction (e.g., a counterclockwise direction) opposite to the first direction. The winding directions of the anode 511, the cathode 512, and the separator 513 are not limited, and various design modifications may be made according to manufacturing methods.

According to an embodiment, the anode 511 may include ananode substrate and ananode mixture surrounding the anode substrate. For example, the anode substrate may be disposed between a pair of anode mixtures. According to an embodiment, the anode substrate may include aluminum (Al). According to an embodiment, the anode mixture may include a lithium (Li) oxide including a transition metal (e.g., at least one of cobalt (Co), manganese (Mn), or iron (Fe)).

According to an embodiment, the cathode 512 may include a cathode substrate and a cathode mixture surrounding the cathode substrate. For example, the cathode substrate may be disposed between a pair of cathode mixtures. According to an embodiment, the cathode substrate may include copper (Cu). According to an embodiment, the cathode mixture may include a graphite and/or lithium (Li) titanium (Ti) oxide.

According to an embodiment, the separator 513 may be positioned between the anode 511 and the cathode 512 and configured for insulation. According to an embodiment, the separator 513 may be a non-conductive porous body that may physically separate the anode 511 and the cathode 512 from each other and move a specified material (e.g., Li ions). According to an embodiment, the separator 513 may be a synthetic resin (e.g., polyethylene or polypropylene).

According to an embodiment, the battery 510 may include the anode tab 514 and the cathode tab 515. According to an embodiment, the anode tab 514 may be electrically connected to the anode 511, and the cathode tab 515 may be electrically connected to the cathode 512. For example, the anode tab 514 may be connected to the anode substrate, and the cathode tab 515 may be connected to the cathode substrate.

According to an embodiment, the anode tab 514 and the cathode tab 515 may be located in different directions with respect to the battery 510. For example, the anode tab 514 may be located in the $(3-1)^{th}$ direction of the battery 510 (e.g., the +Z direction in FIG. 8A), and the cathode tab 515 may be located in the $(3-2)^{th}$ direction of the battery 510 (e.g., the −Z direction in FIG. 8A). As the anode tab 514 and the cathode tab 515 are spaced apart from each other, an internal short circuit of the battery 510 and/or a battery (e.g., the battery 420 of FIG. 4) may be prevented or reduced.

Figure 6A:
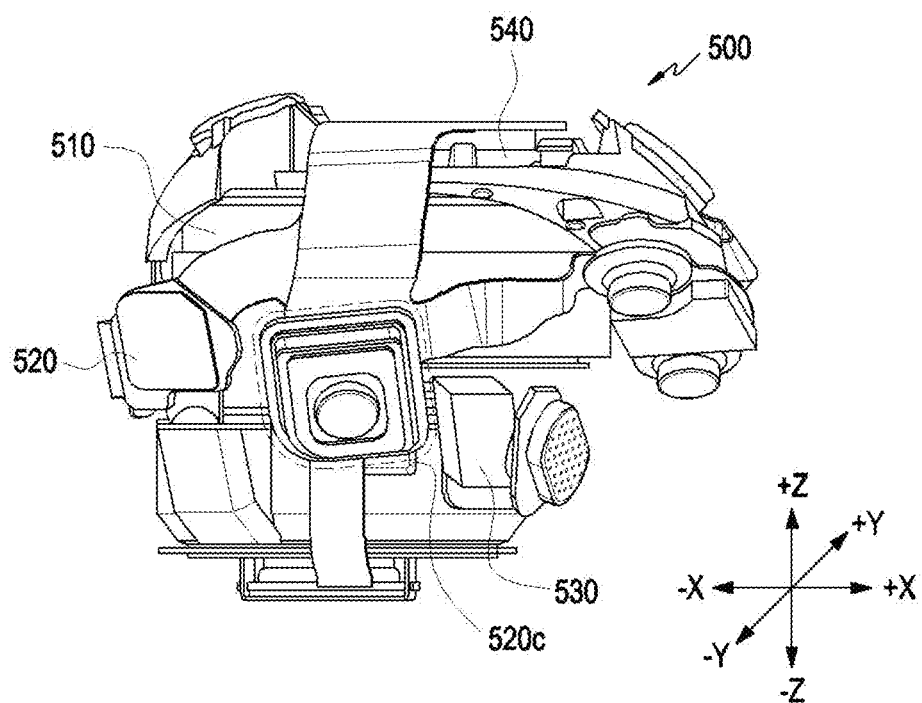
FIGS. 6A to 6E are perspective views illustrating an electronic device according to an embodiment of the disclosure.
Figure 6B:
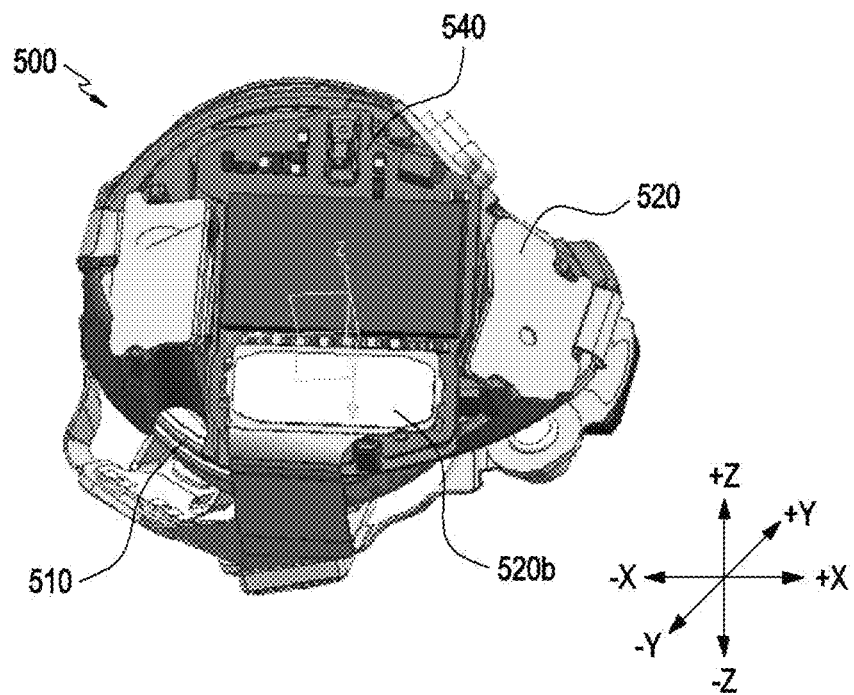
Figure 6C:
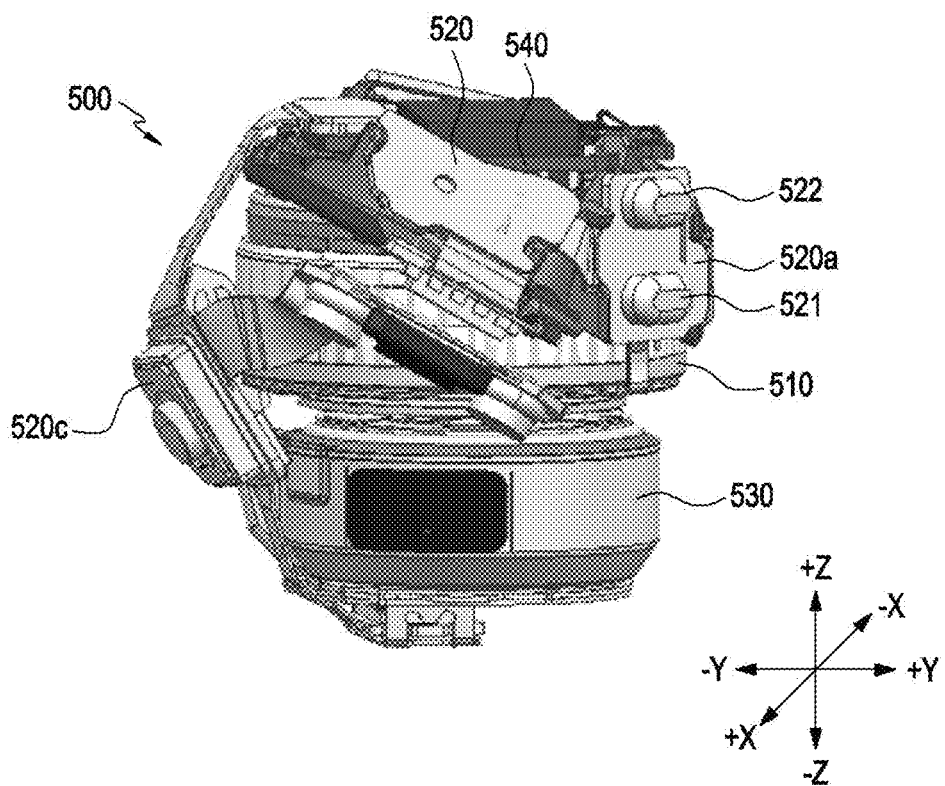
Figure 6D:
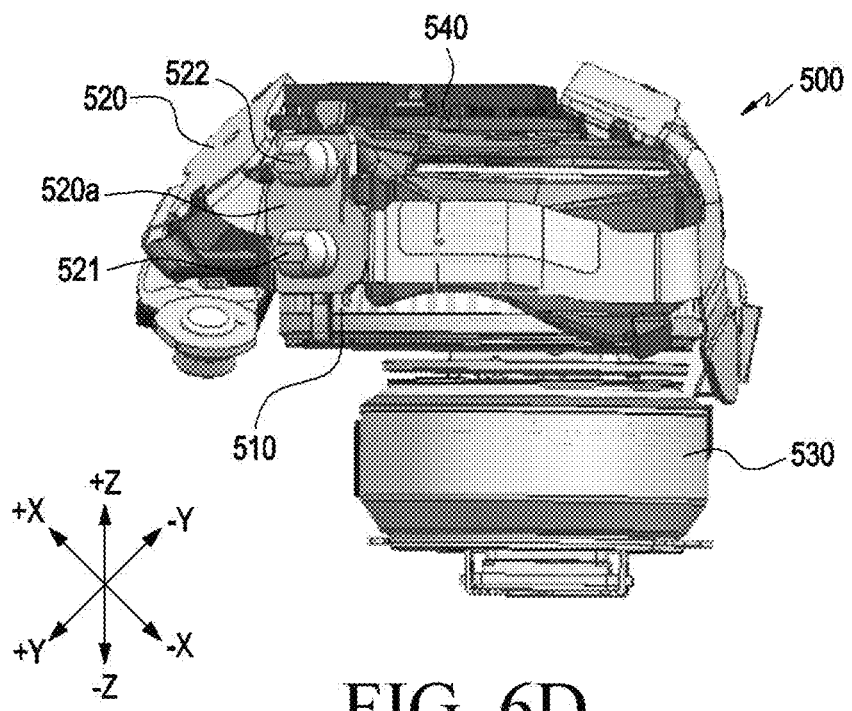
Figure 6E:
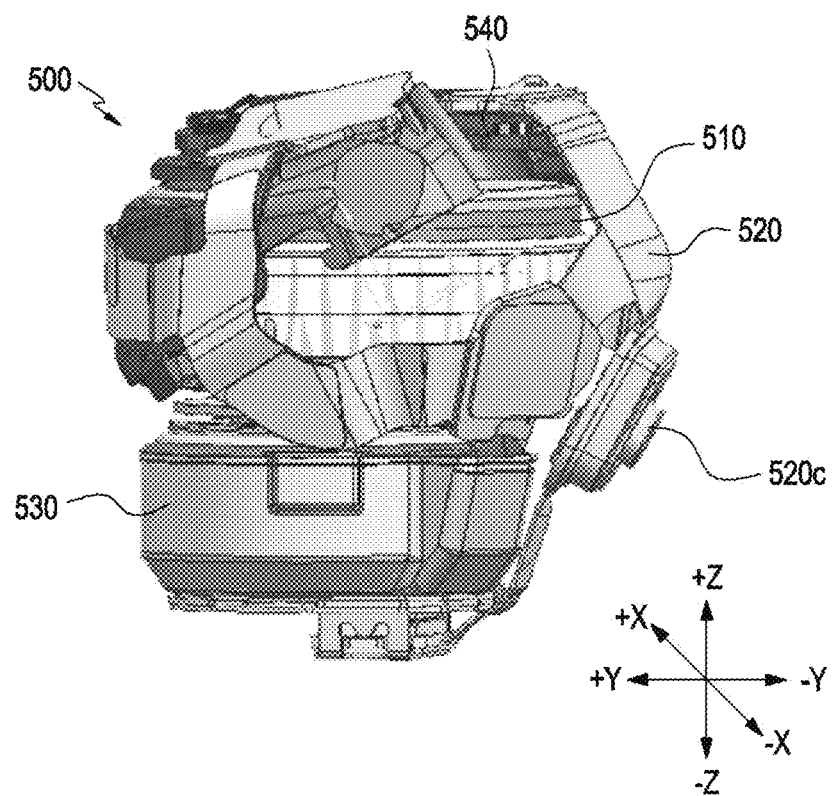

According to an embodiment, referring to FIG. 6A, an FPCB 520 may be electrically connected to the battery 510 and disposed to surround at least part of a side surface of the battery 510. For example, a solder of the FPCB 520 may be electrically connected to the cathode tab 515 and the anode tab 514 of the battery 510. According to an embodiment, a main PCB 540 may be disposed on the battery 510 (e.g., in the +Z direction of FIG. 6A) and electrically connected to the FPCB 520.

According to an embodiment, referring to FIGS. 6A to 6E, the FPCB 520 may surround at least part of the battery 510. The FPCB 520 may be disposed to surround at least part of the speaker 530. For example, the FPCB 520 may surround the battery 510 and the speaker 530 in a third direction (e.g., the Z-axis direction in FIG. 6A). An end of the FPCB 520 may be connected to the main PCB 540.

According to an embodiment, the FPCB 520 may include a power wiring 521 VBAT electrically connected to the anode 511 of the battery 510, a ground wiring 522 GND electrically connected to the cathode 512, and a signal wiring (not shown).

According to an embodiment, current may flow as follows. Current may flow from the anode 511 of the battery 510 to the power wiring 521 of the FPCB 520 through the anode tab 514 connected to the anode 511, flow from the power wiring 521 of the FPCB 520 to the ground wiring 522 of the FPCB 520, and flow to the cathode tab 515 and the cathode 512 of the battery 510 through the ground wiring 522 of the FPCB 520. For example, current may flow from the anode 511 of the battery 510 to the power wiring 521 of the FPCB 520 through the anode tab 514 connected to the anode 511, flow from the power wiring 521 of the FPCB 520 to the main PCB 540 (main PBA), and flow from the main PCB 540 (main PBA) to the ground wiring 522 of the FPCB 520, flow from the ground wiring 522 of the FPCB 520 to a battery protection circuit module integrated circuit (PCM IC), and flow to the cathode tab 515 and the cathode 512 of the battery 510 through the battery PCM IC.

According to an embodiment, the speaker 530 may be disposed close to the battery 510. For example, the speaker 530 may be stacked with the battery 510. For example, the speaker 530 may be disposed coaxially with the battery 510. For example, the central axis of the speaker 530 and the central axis of the battery 510 may be disposed close to each other or coincide with each other. However, the arrangement and position of the speaker 530 is not limited to the above embodiment, and various design modifications may be made depending on the size or arrangement relationship of surrounding structures.

According to an embodiment, the anode 511 and the cathode 512 of the battery 510 may have different lengths. The length of the anode 511 may be a first length (e.g., a length from the central axis of the battery 510 to the anode tab 514), and the length of the cathode 512 may be a second length (e.g., a length from the central axis of the battery 510 to the cathode tab 515) different from the first length. The difference in length between the anode 511 and the cathode 512 may be a third length l3. According to an embodiment, the second length may be greater than the first length. The second length may be greater than the first length by the third length l3. According to an embodiment, the first length may be greater than the second length. However, the lengths of the anode 511 and the cathode 512 are not limited to those of the above embodiment, and many design modifications may be made according to design methods.

According to an embodiment, a first magnetic field may be formed by the anode 511, and a second magnetic field may be formed in a direction opposite to a direction of the first magnetic field by the cathode 512. Since the anode 511 and the cathode 512 are wound overlapping each other, the magnetic fields may be counterbalanced in a section where the anode 511 and the cathode 512 overlap.

According to an embodiment, referring to FIG. 8B, because the lengths of the anode 511 and the cathode 512 are different, a first current formed to flow in a first winding direction ① may flow in the battery 510 due to the difference in length between the cathode 512 and the anode 511. A third magnetic field may be formed by the first current. For example, when the second length (not shown) of the cathode 512 is greater than the first length (not shown) of the anode 511, the third magnetic field may be formed based on a negative current by a longer portion of the cathode 512. When the first current is the negative current, the first winding direction ① may be opposite to the winding directions of the anode 511, the cathode 512, and the separator 513. For example, when the winding directions of the anode 511, the cathode 512, and the separator 513 are clockwise, the first winding direction ① may be counterclockwise. For example, when the winding direction of the battery 510 is counterclockwise, the first winding direction ① may be clockwise.

In general, the third magnetic field generated by the difference in length between the cathode 512 and the anode 511 may affect the nearby speaker 530. For example, current may be induced in a coil of the speaker 530 included in the speaker 530 by the third magnetic field and affect vibration of a diaphragm of the speaker 530, thereby generating noise (e.g., an electromagnetic field). For example, periodic noise may occur due to a peak current.

According to an embodiment, a pure iron sheet may be applied between the battery 510 and the speaker 530 to prevent the noise. According to an embodiment, an eccentric design may be applied to the arrangement of the speaker 530 and the battery 510 to prevent the noise.

According to an embodiment, the disclosure may effectively alleviate or remove noise using at least one wiring of the FPCB 520 through which a second current flows, the second current being formed to flow in a second winding direction ② opposite to the first winding direction ① in which the first current flows. This will be described later.

FIGS. 9A to 10E illustrate noise test results according to the positions of wirings of the FPCB 520.

Figure 9A:
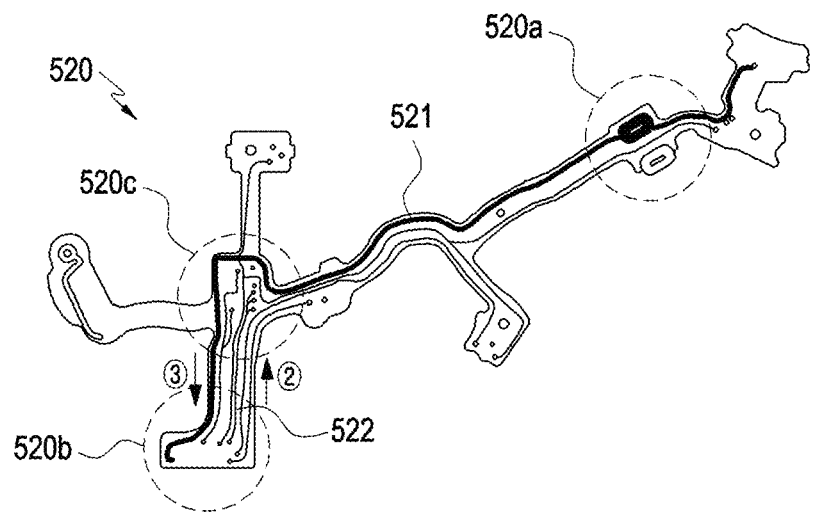
FIG. 9A is a diagram illustrating a printed circuit board according to an embodiment of the disclosure.
Figure 9B:
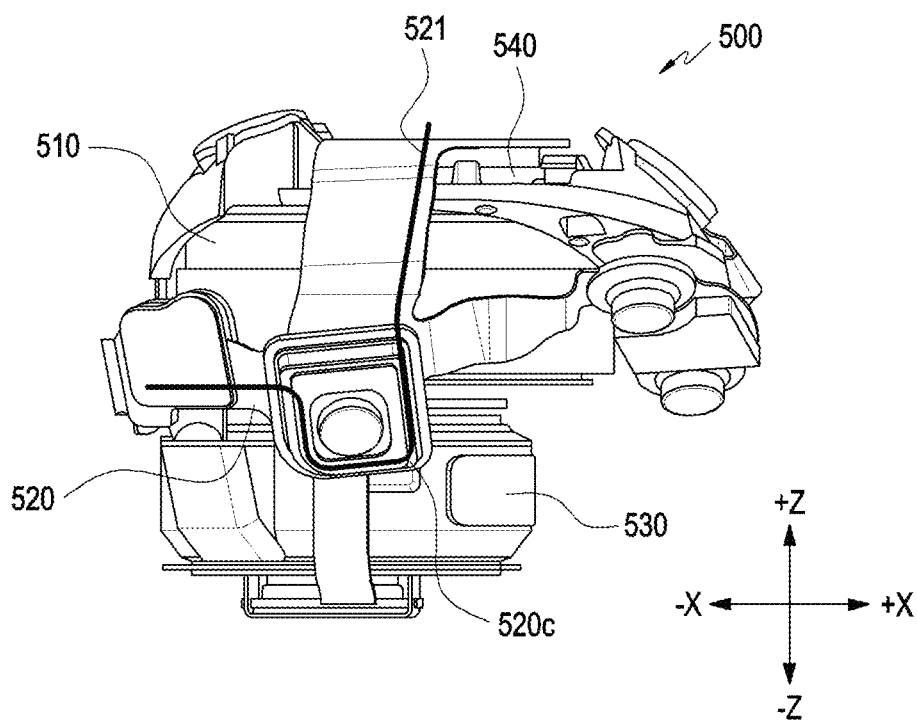
FIG. 9B is a front view illustrating a speaker, a battery, and a printed circuit board according to an embodiment of the disclosure.
Figure 9C:
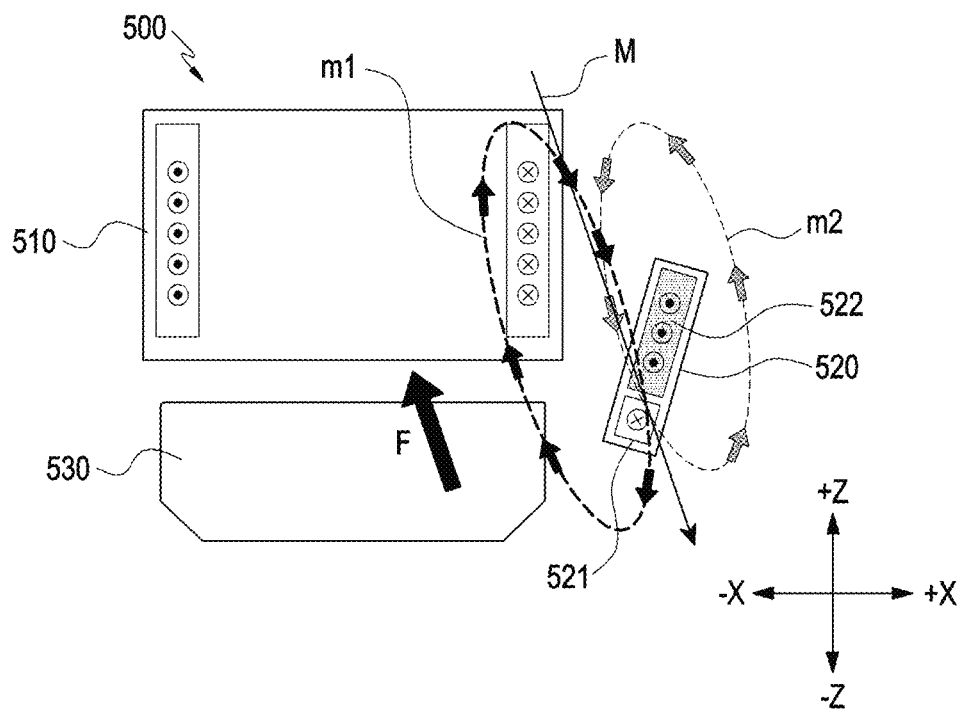
FIG. 9C is a cross-sectional view illustrating the speaker, the battery, and the printed circuit board of FIG. 9B, taken along line A-A', with a current flow and a direction of lines of magnetic force according to an embodiment of the disclosure.
Figure 9D:
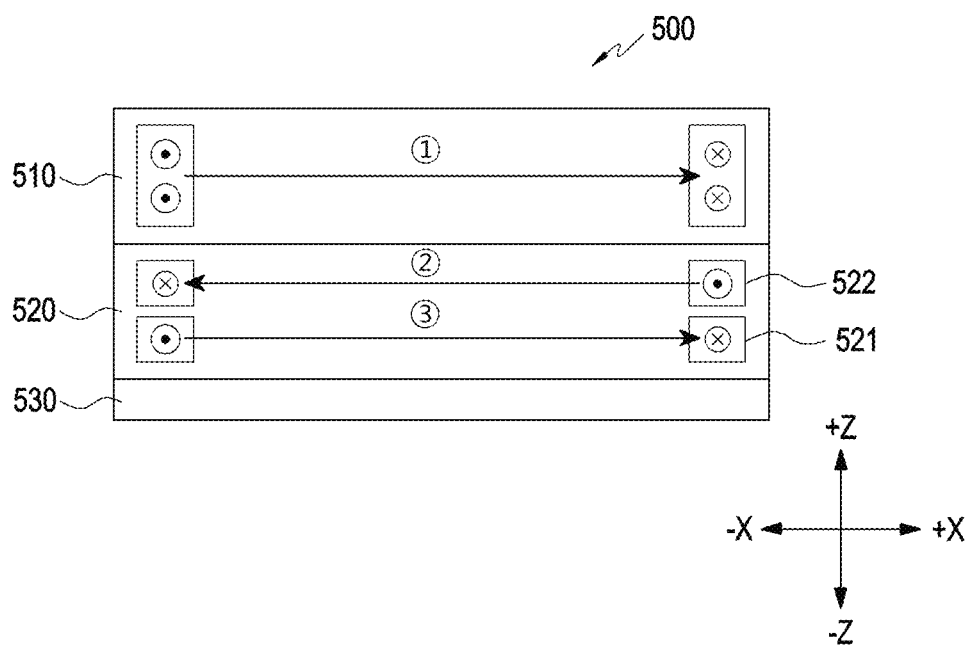
FIG. 9D is a diagram illustrating current directions in a battery and a printed circuit board according to an embodiment of the disclosure.
Figure 9E:
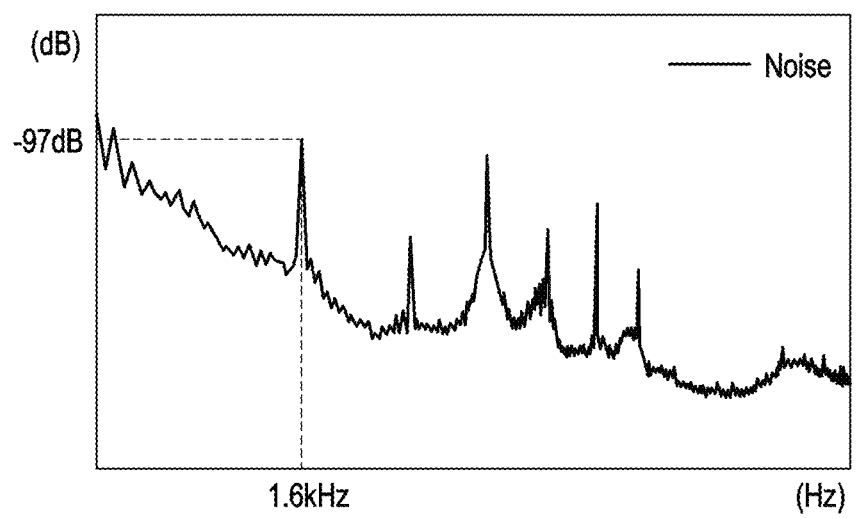
FIG. 9E is a diagram illustrating noise measurement results according to an embodiment of the disclosure.

FIG. 9A is a diagram illustrating the FPCB 520 according to an embodiment of the disclosure. FIG. 9B is a front view illustrating the speaker 530, the battery 510, and the FPCB 520 according to an embodiment of the disclosure. FIG. 9C is a cross-sectional view illustrating the speaker 530, the battery 510, and the FPCB 520 of FIG. 9B, taken along line A-A' according to an embodiment of the disclosure, with a current flow and directions of lines of magnetic force. FIG. 9D is a diagram illustrating current directions in the battery 510 and the FPCB 520 according to an embodiment of the disclosure. FIG. 9E is a diagram illustrating noise measurement results according to an embodiment of the disclosure.

Figure 10A:
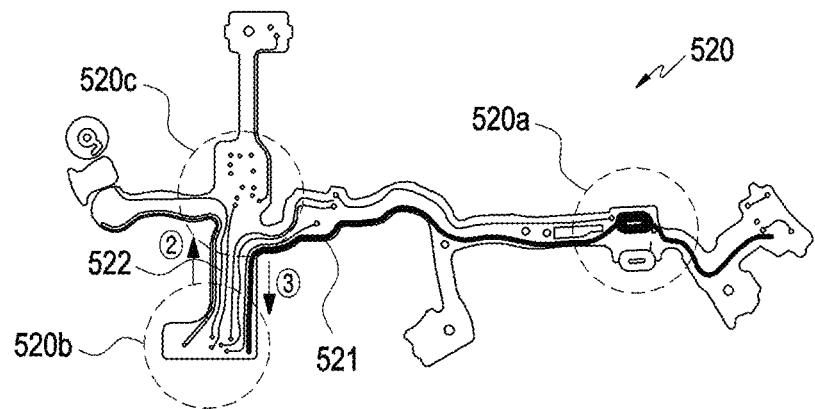
FIG. 10A is a diagram illustrating a printed circuit board according to an embodiment of the disclosure.
Figure 10B:
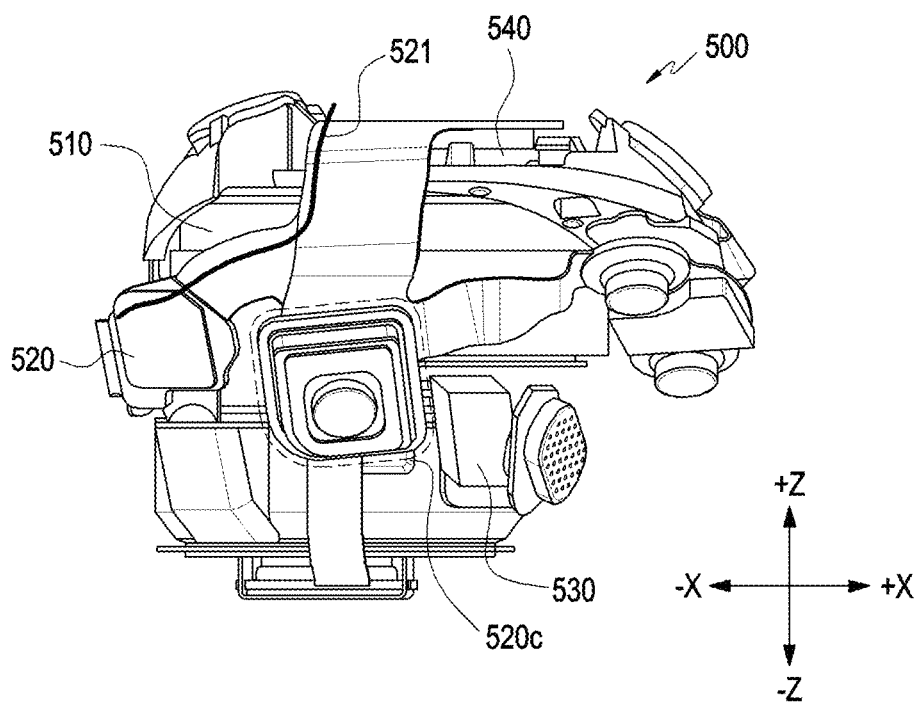
FIG. 10B is a front view illustrating a speaker, a battery, and a printed circuit board according to an embodiment of the disclosure.
Figure 10C:
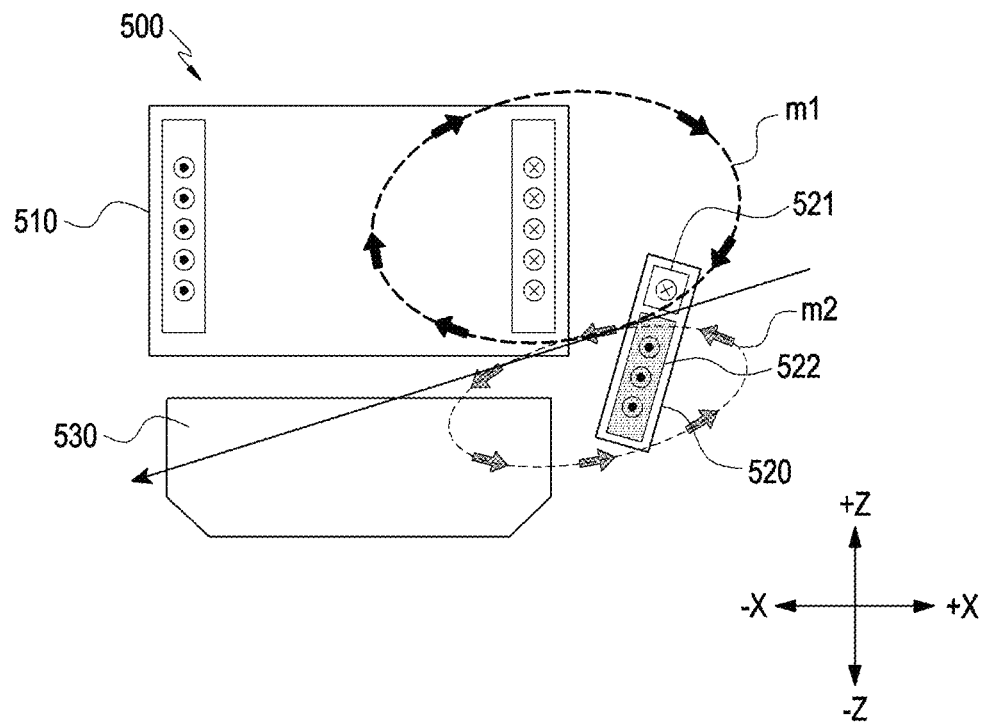
FIG. 10C is a cross-sectional view illustrating the speaker, the battery, and the printed circuit board of FIG. 10B, taken along line A-A', with a current flow and a direction of lines of magnetic force according to an embodiment of the disclosure.
Figure 10D:
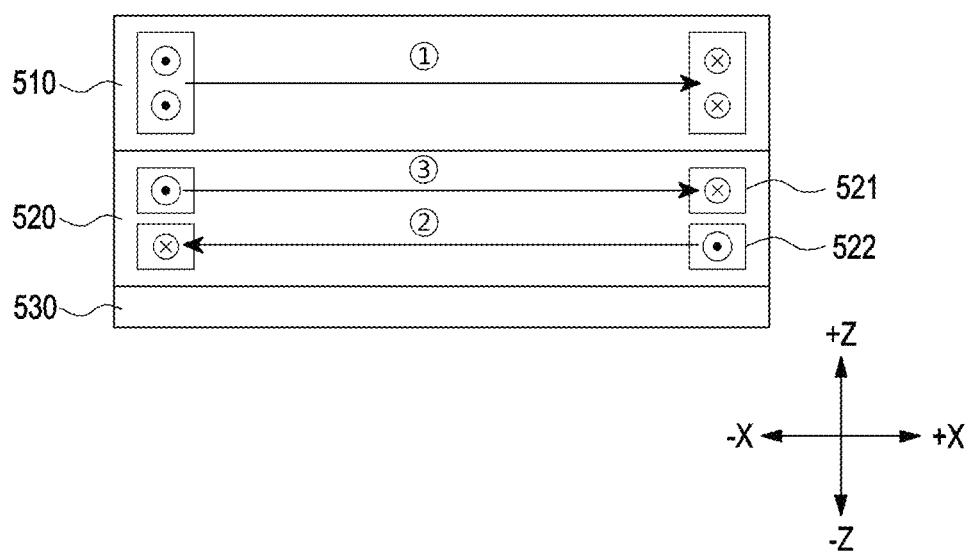
FIG. 10D is a diagram illustrating current directions in a battery and a printed circuit board according to an embodiment of the disclosure.
Figure 10E:
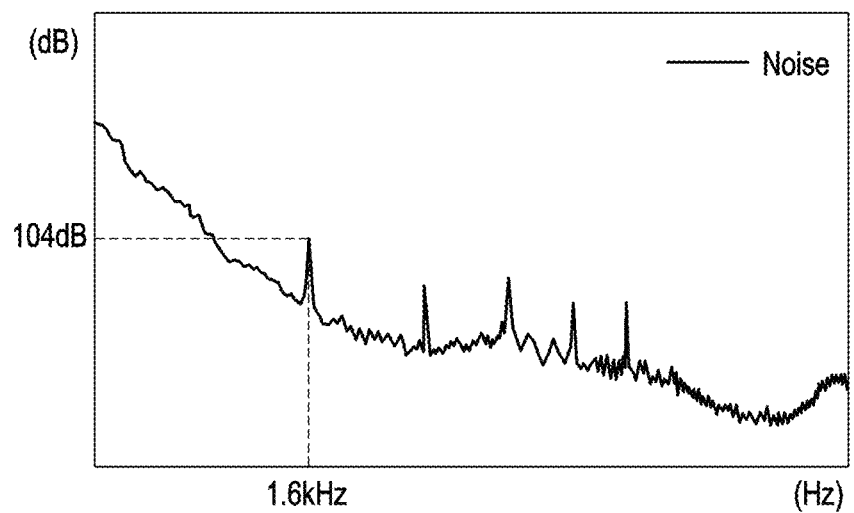
FIG. 10E is a diagram illustrating noise measurement results according to an embodiment of the disclosure.

FIG. 10A is a diagram illustrating the FPCB 520 according to an embodiment of the disclosure. FIG. 10B is a front view illustrating the speaker 530, the battery 510, and the FPCB 520 according to an embodiment of the disclosure. FIG. 10C is a cross-sectional view illustrating the speaker 530, the battery 510, and the FPCB 520 of FIG. 10B, taken along line A-A', with a current flow and directions of lines of magnetic force according to an embodiment of the disclosure. FIG. 10D is a diagram illustrating current directions in the battery 510 and the FPCB 520 according to an embodiment of the disclosure. FIG. 10E is a diagram illustrating noise measurement results according to an embodiment of the disclosure.

Referring to FIGS. 9A to 10E, according to an embodiment, the electronic device 500 (e.g., the electronic device 101 of FIG. 1 or the electronic device 300 of FIGS. 3 and 4) may include a housing (e.g., the first housing 310 and the second housing 320 of FIGS. 3 and 4), the battery 510 disposed inside the housing, and the FPCB 520 (e.g. a PCB or an RFPCB) disposed to surround at least part of a side surface of the battery 510, the speaker 530 stacked with the battery 510, and the main PCB 540 disposed on the battery 510.

Referring to FIGS. 9A to 10E, the configurations of the electronic device 500, the battery 510, the FPCB 520, and the speaker 530 of FIGS. 9A to 10E may be wholly or partially identical to those of the electronic device 500, the battery 510, the FPCB 520, and the speaker 530 of FIGS. 6A to 8B. The structures of FIGS. 10A to 10E may be selectively combined with the structures of FIGS. 6A to 8B.

In FIGS. 9A to 10E, 'X' may be defined and interpreted as a width direction of the electronic device 500, 'Y' may be defined and interpreted as a depth direction of the electronic device 500, and 'Z' may be defined and interpreted as a height direction of the electronic device 500. In an embodiment of the disclosure, 'X' may mean the $(1-1)^{th}$ direction (+X direction) and the $(1-2)^{th}$ direction (-X direction). In an embodiment of the disclosure, 'Y' may mean the $(2-1)^{th}$ direction (+Y direction) and the $(2-2)^{th}$ direction (-Y direction). In an embodiment of the disclosure, 'Z' may mean the $(3-1)^{th}$ direction (+Z direction) and the $(3-2)^{th}$ direction (-Z direction).

According to an embodiment, the first current formed to flow in the first winding direction ① may flow in the battery 510 due to the difference in length between the cathode 512 and the anode 511. The second current formed to flow in the second winding direction ② may flow through the ground wiring 522 of the FPCB 520. A third current formed to flow in a third winding direction ③ may flow through the power wiring 521 of the FPCB 520. The second winding direction ② and the third winding direction ③ may be opposite to each other. FIGS. 9A to 10E are based on the assumption that the electronic device 500 is mounted on a user's left body.

FIGS. 9A to 10E are based on the assumption that the battery 510 is wound in the clockwise direction, and the first winding direction ① is the counterclockwise direction, like FIG. 8.

According to an embodiment, referring to FIGS. 9A and 9B, the power wiring 521 of the FPCB 520 may be formed as a single thick wiring. The ground wiring 522 may be formed of a plurality of thin wirings. When a position at which the power wiring 521 of the FPCB 520 is disposed is briefly shown on the drawing and the remaining portion is defined as a position at which the ground wiring 522 is disposed, the power wiring 521 may be disposed closer to the speaker 530 than the ground wiring 522.

According to an embodiment, a first area 520*a* of the FPCB 520 may be an area including a solder directly connected to the battery 510. The solder of the FPCB 520 may be electrically connected to the cathode tab 515 and the anode tab 514 of the battery 510. The first area 520*a* may be in a shape surrounding at least part of a side surface of the battery 510.

According to an embodiment, a second area 520*b* of the FPCB 520 may be an area electrically connected to the main PCB 540. An end of the second area 520*b* may contact the main PCB 540.

According to an embodiment, a third area 520*c* of the FPCB 520 may contact at least part of side surfaces of the battery 510 and the speaker 530. The wiring arrangement of the third area 520*c* may determine the direction of a magnetic field and affect noise generation. According to an embodiment, referring to FIGS. 9A and 9B, the power wiring 521 maybe disposed in a downward direction (e.g., the -Z direction in FIG. 9B), and the ground wiring 522 may be disposed in an upward direction (e.g., the +Z direction in FIG. 9B) in the third area 520*c*. According to an embodiment, referring to FIGS. 10A and 10B, the power wiring 521 may be disposed in the upward direction (e.g., the +Z direction of FIG. 9B), and the ground wiring 522 may be disposed in the downward direction (e.g., -Z direction of FIG. 9B), in the third area 520*c*. Different directions of a magnetic field and different noise according to wiring positions will be described below.

According to an embodiment, the second current flowing through the ground wiring 522 of the FPCB 520 may be flow in an opposite direction to the first current of the battery 510. The third current flowing through the power wiring 521 of the FPCB 520 may flow in the same direction as the first current of the battery 510 (see FIG. 9D). For example, when the first winding direction ① is counterclockwise, the second winding direction ② may be clockwise, and the third winding direction ③ may be counterclockwise.

According to an embodiment, a current flowing in a wiring disposed closer to the speaker 530 between the power wiring 521 and the ground wiring 522 of the FPCB 520 may be flow in the same direction as the first current of the battery 510. Referring to FIGS. 9C and 9D, the third current flowing through the power wiring 521 disposed closer to the speaker 530 between the power wiring 521 and the ground wiring 522 of the FPCB 520 may be flow in the same direction as the first current of the battery 510. The second current flowing in the ground wiring 522 disposed further apart from the speaker 530 between the power wiring 521 and the ground wiring 522 of the FPCB 520 may flow in the opposite direction to the first current of the battery 510. For example, referring to FIGS. 9C and 9D, the first winding direction ①, in which the first current flows through the battery 510, may be counterclockwise, the second winding direction ② of the second current flowing through the ground wiring 522 relatively spaced apart from the speaker 530 may be clockwise, and the third winding direction ③ of the third current flowing through the power wiring 521 disposed relatively close to the speaker 530 may be counterclockwise. However, the directions of currents flowing through the battery 510 and the power wiring 521 and the ground wiring 522 of the FPCB 520 are not limited to the above embodiment, and various design modifications may be made by the shape, arrangement relationship, and/or structure of the electronic device 500.

According to an embodiment, as the power wiring 521 of the FPCB 520 through which a current flows in the same direction as the first current of the battery 510 is disposed closer to the speaker 530, a magnetic force line M of the FPCB 520 may be formed to face, for example, between the +X direction and the −Z direction of FIG. 9C. The magnetic force line M of the FPCB 520 may be the sum of a magnetic force m1 formed by the power wiring 521 and a magnetic force m2 formed by the ground wiring 522. At least part of the magnetic force m1 formed by the power wiring 521 of the FPCB 520 may penetrate at least part of the speaker 530 in an upward direction F. At least part of the magnetic force m1 formed by the power wiring 521 may penetrate, for example, at least part of the speaker 530 between the −X direction and the +Z direction of FIG. 9C. As a result, noise may occur.

According to an embodiment, referring to FIG. 9E, a peak noise level generated by the magnetic field of the FPCB 520 may be −97 dB at 1.6 kHz.

According to an embodiment, referring to FIGS. 10A and 10B, when a position at which the power wiring 521 of the FPCB 520 is disposed is briefly shown on the drawing, and the remaining portion is defined as a position at which the ground wiring 522 is disposed, the ground wiring 522 may be disposed closer to the speaker 530 than the power wiring 521.

According to an embodiment, a current flowing in a wiring (e.g., the ground wiring 522) disposed closer to the speaker 530 between the power wiring 521 and the ground wiring 522 of the FPCB 520 may flow in the opposite direction to the first current of the battery 510. Referring to FIGS. 10C and 10D, the second current flowing through the ground wiring 522 disposed closer to the speaker 530 between the power wiring 521 and the ground wiring 522 of the FPCB 520 may flow in the opposite direction to the first current of the battery 510. The third current flowing in the power wiring 521 disposed further apart from the speaker 530 between the power wiring 521 and the ground wiring 522 of the FPCB 520 may flow in the same direction as the first current of the battery 510. For example, referring to FIGS. 10C and 10D, the first winding direction ①, in which the first current flows through the battery 510, may be counterclockwise, the second winding direction ② of the second current flowing through the ground wiring 522 disposed relatively close to the speaker 530 may be clockwise, and the third winding direction ③ of the third current flowing through the power wiring 521 disposed relatively apart from the speaker 530 may be counterclockwise.

According to an embodiment, as the ground wiring 522 of the FPCB 520 through which a current flows in the opposite direction to the first current of the battery 510 is disposed closer to the speaker 530, the magnetic force line M of the FPCB 520 may be formed to face, for example, between the −X direction and the −Z direction of FIG. 10C. The magnetic force line M of the FPCB 520 may be the sum of the magnetic force m1 formed by the power wiring 521 and the magnetic force m2 formed by the ground wiring 522. Although the magnetic force m2 formed by the ground wiring 522 of the FPCB 520 may penetrate at least part of the speaker 530, this may be counterbalanced due to the opposite direction to the third magnetic field formed by the battery 510. Accordingly, noise may be reduced or canceled.

According to an embodiment, referring to FIG. 10E, a peak noise level generated by the magnetic field of the FPCB 520 may be −104 dB at 1.6 kHz. It may be noted that a noise value is reduced, compared to noise (FIG. 9E) in the electronic device 500 according to an embodiment.

It may be noted that when the ground wiring 522 formed to allow the second current to flow therethrough in the second winding direction ② opposite to the first winding direction ① is disposed closer to the speaker 530, a noise value is reduced compared to the respective embodiments (e.g., FIGS. 9A to 9E and FIGS. 10A to 10E).

In general, the third magnetic field caused by the difference in length between a cathode (e.g., the cathode 512 of FIG. 8A) and ananode (e.g., the anode 511 of FIG. 8A) mounted inside a battery (e.g., the battery 510 of FIG. 6A) may affect a nearby speaker (e.g., the speaker 530 of FIG. 6A). For example, a current may be induced in a coil included in the speaker 530 by the third magnetic field and affect vibration of a diaphragm of the speaker 530, thereby causing noise (e.g., an electromagnetic field). For example, periodic noise may occur due to a peak current.

According to an embodiment of the disclosure, noise may be effectively alleviated or cancelled by disposing at least one wiring of the FPCB 520, which is formed to allow a current to flow therethrough in an opposite direction to a current flowing in the battery 510 to prevent and/or reduce noise, close to the speaker 530.

An electronic device (e.g., the electronic device 500 in FIG. 6A) according to an example embodiment of the disclosure may include: a battery (e.g., the battery 510 in FIG. 8A) including an anode (e.g., the anode 511 in FIG. 8A) having a first length and a cathode (e.g., the cathode 512 in FIG. 8A) having a second length different from the first length; a flexible printed circuit board (e.g., the flexible printed circuit board 520 in FIG. 6A) electrically connected to the battery and surrounding at least part of a side surface of the battery; and a speaker (e.g., the speaker 530 in FIG. 6A) stacked with the battery. The flexible printed circuit board may include a power wiring (e.g., the power wiring 521 in FIG. 9A) electrically connected to the anode and a ground wiring (e.g., the ground wiring 522 in FIG. 9A) electrically connected to the cathode.

A first current of a first winding direction (e.g., the first winding direction ① in FIG. 10D) generated due to a length difference between the cathode and the anode may flow in the battery. Noise may be canceled and/or reduced by allowing a second current of a second winding direction (e.g., the second winding direction ② in FIG. 10D) opposite to the first winding direction to flow in a wiring disposed closer to the speaker between the power wiring and the ground wiring.

According to an example embodiment, the second length may be greater than the first length.

According to an example embodiment, the battery may include an electrode assembly in a shape of a roll with the anode and the cathode wound therearound.

According to an example embodiment, a winding direction of the electrode assembly may be opposite to the first winding direction.

According to an example embodiment, at least part of a first magnetic field formed in the battery may be counterbalanced by a second magnetic field formed by the second current.

According to an example embodiment, a third current of a third winding direction (e.g., ③ in FIG. 10D) identical to the first winding direction may flow in a wiring spaced further apart from the speaker between the power wiring and the ground wiring.

According to an example embodiment, the ground wiring may be disposed closer to the speaker than the power wiring.

According to an example embodiment, the power wiring may be disposed closer to the speaker than the ground wiring.

According to an example embodiment, a central axis of the battery may correspond to a central axis of the speaker.

According to an example embodiment, the electrode assembly may further include an anode tab connected to the anode and a cathode tab connected to the cathode.

According to an example embodiment, the electrode assembly may further include a separator disposed between the anode and the cathode.

An electronic device (e.g., the electronic device in FIG. 6A) according to an example embodiment may include: a battery including an anode having a first length and a cathode having a second length greater than the first length; a flexible printed circuit board electrically connected to the battery and surrounding at least part of a side surface of the battery; and a speaker stacked with the battery.

The flexible printed circuit board may include a power wiring electrically connected to the anode and a ground wiring electrically connected to the cathode, a first current of a first winding direction generated due to a length difference between the cathode and the anode may flow in the battery, and a second current of a second winding direction opposite to the first winding direction may flow in the ground wiring disposed closer to the speaker than the power wiring.

According to an example embodiment, the battery may include an electrode assembly in a shape of a roll with the anode and the cathode wound therearound.

According to an example embodiment, a winding direction of the electrode assembly may be opposite to the first winding direction.

According to an example embodiment, at least part of a first magnetic field formed in the battery may be counterbalanced by a second magnetic field formed by the second current.

According to an example embodiment, a third current of a third winding direction identical to the first winding direction may flow in the power wiring.

According to an example embodiment, a central axis of the battery may correspond to a central axis of the speaker.

According to an example embodiment, the electrode assembly may further include an anode tab connected to the anode and a cathode tab connected to the cathode.

According to an example embodiment, the electrode assembly may further include a separator disposed between the anode and the cathode.

An electronic device (e.g., the electronic device 500 in FIG. 6A) according to an example embodiment of the disclosure may include: a battery including an anode having a first length and a cathode having a second length greater than the first length; a flexible printed circuit board electrically connected to the battery and surrounding at least part of a side surface of the battery; and a speaker stacked with the battery.

The flexible printed circuit board may include a power wiring electrically connected to the anode and a ground wiring electrically connected to the cathode, a first current of a first winding direction generated due to a length difference between the cathode and the anode may flow in the battery, and a second current of a second winding direction identical to the first winding direction may flow in the power wiring disposed closer to the speaker than the ground wiring.

The above-described battery (e.g., the battery 510 of FIG. 6A) and electronic device (e.g., the electronic device 500 of FIG. 6A) including the same according to various example embodiments of the disclosure are not limited to the foregoing embodiments and drawings, and it will be apparent to those skilled in the art that many replacements, modifications, and changes can be made within the scope of the disclosure.

What is claimed is:

1. An electronic device comprising:
   a battery including an anode having a first length and a cathode having a second length different from the first length;
   a flexible printed circuit board electrically connected to the battery and surrounding at least part of a side surface of the battery; and
   a speaker stacked with the battery,
   wherein the flexible printed circuit board includes a power wiring electrically connected to the anode and a ground wiring electrically connected to the cathode,
   wherein a first current of a first winding direction generated due to a length difference between the cathode and the anode is configured to flow in the battery, and
   wherein a second current of a second winding direction opposite to the first winding direction is configured to flow in a wiring disposed closer to the speaker between the power wiring and the ground wiring.

2. The electronic device of claim 1, wherein the second length is greater than the first length.

3. The electronic device of claim 1, wherein the battery includes an electrode assembly comprising electrodes in a shape of a roll with the anode and the cathode wound therearound.

4. The electronic device of claim 3, wherein a winding direction of the electrode assembly is opposite to the first winding direction.

5. The electronic device of claim 1, wherein at least part of a first magnetic field formed in the battery is configured to be counterbalanced by a second magnetic field formed by the second current.

6. The electronic device of claim 1, wherein a third current of a third winding direction identical to the first winding direction is configured to flow in a wiring spaced further apart from the speaker between the power wiring and the ground wiring.

7. The electronic device of claim 1, wherein the ground wiring is disposed closer to the speaker than the power wiring.

8. The electronic device of claim 1, wherein the power wiring is disposed closer to the speaker than the ground wiring.

9. The electronic device of claim 1, wherein a central axis of the battery corresponds to a central axis of the speaker.

10. The electronic device of claim 3, wherein the electrode assembly further includes an anode tab connected to the anode and a cathode tab connected to the cathode.

11. The electronic device of claim 3, wherein the electrode assembly further includes a separator disposed between the anode and the cathode.

12. An electronic device comprising:
    a battery including an anode having a first length and a cathode having a second length greater than the first length;

a flexible printed circuit board electrically connected to the battery and surrounding at least part of a side surface of the battery; and a speaker stacked with the battery, wherein the flexible printed circuit board includes a power wiring electrically connected to the anode and a ground wiring electrically connected to the cathode, wherein a first current of a first winding direction generated due to a length difference between the cathode and the anode is configured to flow in the battery, and wherein a second current of a second winding direction opposite to the first winding direction is configured to flow in the ground wiring disposed closer to the speaker than the power wiring.

13. The electronic device of claim 12, wherein the battery includes an electrode assembly comprising electrodes in a shape of a roll with the anode and the cathode wound therearound.

14. The electronic device of claim 13, wherein a winding direction of the electrode assembly is opposite to the first winding direction.

15. The electronic device of claim 12, wherein at least part of a first magnetic field formed in the battery is counterbalanced by a second magnetic field formed by the second current.

16. The electronic device of claim 12, wherein a third current of a third winding direction identical to the first winding direction is configured to flow in the power wiring.

17. The electronic device of claim 12, wherein a central axis of the battery corresponds to a central axis of the speaker.

18. The electronic device of claim 13, wherein the electrode assembly further includes an anode tab connected to the anode and a cathode tab connected to the cathode.

19. The electronic device of claim 13, wherein the electrode assembly further includes a separator disposed between the anode and the cathode.

20. An electronic device, comprising:

a battery including an anode having a first length and a cathode having a second length greater than the first length;

a flexible printed circuit board electrically connected to the battery and surrounding at least part of a side surface of the battery; and a speaker stacked with the battery, wherein the flexible printed circuit board includes a power wiring electrically connected to the anode and a ground wiring electrically connected to the cathode, wherein a first current of a first winding direction generated due to a length difference between the cathode and the anode is configured to flow in the battery, and wherein a second current of a second winding direction identical to the first winding direction is configured to flow in the power wiring disposed closer to the speaker than the ground wiring.

\* \* \* \* \*